Nov. 28, 1961 H. W. SULLIVAN 3,011,025

HIGH POWER AMPLIFIER

Filed Oct. 5, 1959

Inventor
HERBERT W. SULLIVAN
By Soans, Anderson, Luedeka & Fitch
Attys

1

3,011,025
HIGH POWER AMPLIFIER
Herbert W. Sullivan, New York, N.Y.
Filed Oct. 5, 1959, Ser. No. 844,335
11 Claims. (Cl. 179—1)

The present invention relates to high power amplifiers and more particularly to the amplification of audio signals where a relatively high amount of output power is required with less regard to the fidelity of amplification.

Normally, audio amplifiers are designed to reduce distortion as much as possible so that the output from the amplifier is an amplified reproduction of the original sound wave. Because of this, most previously available audio amplifiers have utilized linear systems of amplification, either Class A or Class B. In a Class A vacuum tube amplifier, the grid bias and the alternating grid voltage are such that the plate current in a specific tube flows throughout the entire electrical cycle and in a class A transistor, amplifier the transistor conducts over the entire cycle.

While class A amplifiers provide an output wave which is a reasonable facsimile of the input signal, the power output for a given size tube or transistor is relatively low. In this connection, the plate efficiency (i.e., the ratio of the output power to D.C. input power to the plate of the tube) or the collector efficiency (i.e., the ratio of the output power to D.C. input power to the collector of the transistor), as the case may be, is relatively low.

In view of the low plate or collector efficiency of a class A amplifier, it has customarily been the practice, in order to obtain more power output for a given size tube or transistor, to operate the output stage of an audio amplifier as a class B amplifier. In a class B vacuum tube amplifier, the grid bias is approximately equal to the cut-off value so that plate current flows approximately one-half of each cycle when an alternating grid voltage is applied, and in a class B transistor amplifier, the transistor is biased so that it is cut off over either the positive or negative part of the cycle.

The distortion inherent in class B operation is substantially eliminated by connecting two class B amplifiers in push-pull. While a push-pull class B amplifier provides satisfactory operation for most applications, in vacuum tubes, the plate efficiency is limited to approximately 60 percent and, in transistors, the collector efficiency is limited to approximately 78 percent.

Accordingly, an object of the present invention is the provision of an audio amplifier which has a higher efficiency than previously available audio amplifiers. Another object of the invention is the provision of an audio amplifier which uses smaller components to attain a given power output. A further object is the provision of a high efficiency audio amplifier which is relatively inexpensive and simple to manufacture.

Other objects and advantages of the present invention will become apparent by reference to the following description and accompanying drawings.

Generally, an audio amplifier in accordance with the present invention comprises a source of speech input signals, and means responsive to the input signal to modify the wave shape of the signal so that it is substantially rectangular shaped and varies in duration proportionately as the time between zero crossings of the input signal. Means are provided for amplifying the modified signal, the amplifying means being controlled by the modified signal to operate only in a cut-off condition and a conducting condition. A sound reproducing means is connected to the amplifying means.

2

Since the power dissipated in a vacuum tube or transistor is dependent upon the voltage across the tube or transistor times the current through the tube or transistor, if the output stage is operated as a switch, that is, the stage is biased so that the input signal causes the tube to either operate at cut-off or at full conduction, a very high plate or collector efficiency may be obtained. The power dissipation in such an output stage for a given power output is relatively low since at cut-off the voltage is high but the current is nearly zero, and at full conduction the current is high but the voltage is relatively low. If the switching time between the cut-off and full conduction can be made fast enough, the efficiency of such an amplifier may be approximately between 95 and 99 percent. Consequently, for the same power output as a class B amplifier, a much smaller tube or transistor may be used. Hence, by using a switching amplifier as an output stage of an audio amplifier, much smaller tubes may be used in the output stage, and a greater output will be obtained for the same input power to the audio amplifier.

Figure 2:
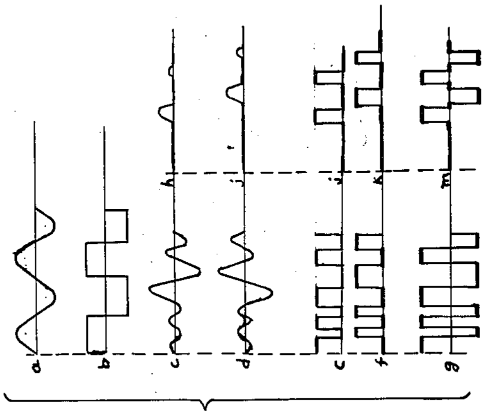
FIGURE 2 is a set of curves indicating the wave shapes through various stages of the audio amplifier shown in FIGURE 1.

It should be realized, however, that the output wave form from a switching amplifier is a rectangular wave, which may appear to be incompatible with the highly intricate and ever changing pattern of an ordinary audio wave. It is well known, however, that highly intelligible speech may be attained if the speech is heavily compressed. When compression is carried to its extreme, the speech is clipped and becomes a series of rectangular pulses. For example, FIGURE 2*b* shows a rectangular wave produced when the sine wave shown in FIGURE 2*a* is heavily compressed. The intelligibility of speech so clipped is not impaired and, in fact, the intelligibility tends to be improved in a high ambient noise level.

Figure 1:
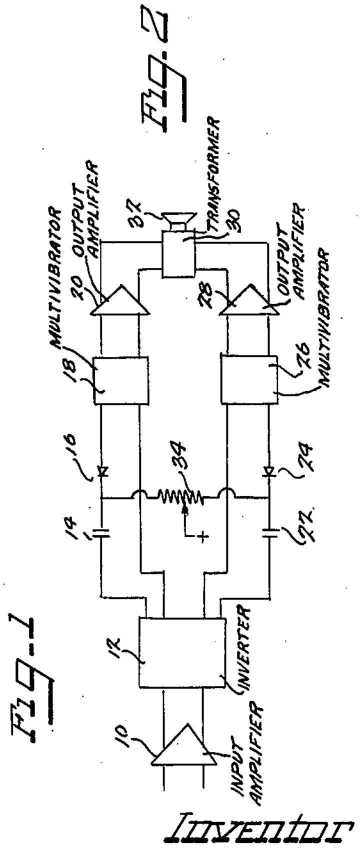
FIGURE 1 is a schematic circuit diagram of an audio amplifier showing various features of the present invention.

An audio amplifier incorporating a switching amplifier as an output stage, is shown in block form in FIGURE 1. The audio amplifier includes an input amplifier 10 to which an audio wave is fed. The audio wave may be derived from any suitable source (not shown) such as microphone, phonograph pickup, etc. The audio wave is amplified by the input amplifier stage 10, and the output wave from the input stage 10 is fed to a phase inverter 12. The phase inverter 12 provides a pair of waves which are 180° out of phase with each other, as shown in FIGURES 2*c* and 2*d*.

One of the waves (FIGURES 2*c*) is fed through a coupling condenser 14 and a rectifier 16, which will be described hereinafter, to a trigger or multivibrator circuit 18 which multivibrator circuit 18 converts the complex audio wave into a series of rectangular pulses of equal amplitude, as shown in FIGURE 2*e*. The audio wave is converted into a rectangular wave of constant amplitude so as to assure that an output stage 20, which is connected to the output of the multivibrator circuit 18, operates either in a cut-off condition or a fully conducting condition. Moreover, the rectangular wave provides a fast transient time between the positions, thereby keeping the plate or power dissipation at a minimum.

The other signal (FIGURE 2*d*) from the phase inverter 12, which signal is 180° out of phase with the first signal, is likewise fed through coupling condenser 22 and a rectifier 24 to a multivibrator circuit 26 the output wave from which is shown in FIGURE 2*f*. The output wave from the multivibrator circuit 26 is, in turn, fed to an output stage 28.

The rectangular output waves from the output stages 20 and 28 are suitably combined in a transformer 30, which is connected to the output stages 20 and 28, to form a composite rectangular wave, as shown in FIGURE 2*g*. The composite rectangular wave is then fed to an electromechanical transducer, such as a speaker 32.

As can be seen from the waves shown in FIGURES 2*c* through 2*g*, the output stages 20 and 28 are switched from a cut-off position to a fully conducting position in response to the slightest amplitude of the audio wave. It should be realized that this would make the audio amplifier subject to operation by noise pickup in the source and amplifier, and hence the slightest noise would produce a high power, random output wave. To prevent noise pickup from operating the output stages 20 and 28, the audio amplifier is provided with a clipping means to eliminate the smaller amplitude waves in the audio signal. As shown in FIGURE 1, the clipping means is provided by the biased rectifiers 16 and 24 disposed between the phase inverter 12 and each of the multivibrators 18 and 26. Each rectifier 16 and 24 is biased by a D.C. voltage source (not shown) connected to the rectifiers 16 and 24 through a common potentiometer 34. By biasing the rectifiers 16 and 24, a threshold level is provided below which no output signal is provided. FIGURES 2*h* through 2*m* show the effect of the threshold level on the waves shown in FIGURES 2*c* through 2*g*, respectively.

For high articulation, the threshold level should be as low as possible and just sufficiently high to discriminate between the desired speech and the background noise. Accordingly, while the voltage source biasing the rectifiers 16 and 24 may be of a fixed amplitude, it is generally preferred to have a higher threshold for strong signals, and smaller threshold for weak signals. Such a variable threshold may be provided by sampling the audio wave and rectifying the sampled signal to provide a D.C. biasing voltage which is proportional to the envelope of the audio wave.

Figure 3:
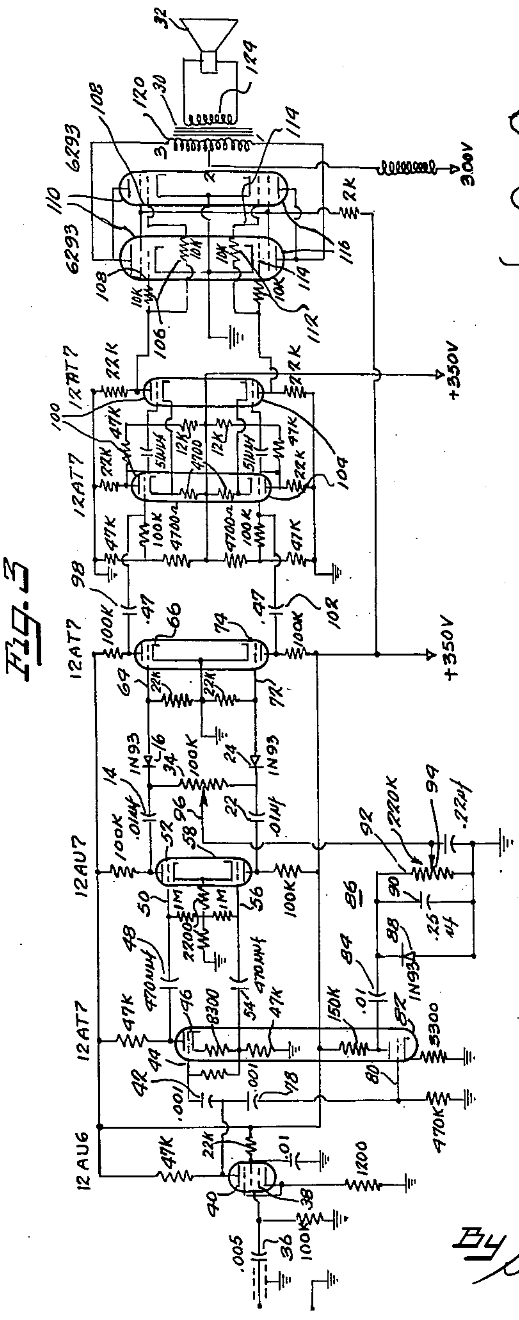
FIGURE 3 is a circuit diagram of an audio amplifier showing various features of the present invention.

It should be realized that the audio amplifier may be constructed with vacuum tubes, or transistors, or a combination of transistors and vacuum tubes, or other amplifying means. FIGURE 3 shows a vacuum tube circuit which incorporates the teachings of the present invention.

The audio signal from a microphone (not shown) or other source of audio signal is fed through a coupling capacitor 36 to the control grid 38 of a pentode 40 connected as a conventional audio amplifier. The pentode 40 and its associated circuit are designated by the reference numeral 10 in FIGURE 1. The output from the audio amplifier stage is connected through a coupling condenser 42 to the control grid 44 of a triode 46 connected as a conventional phase inverter which provides a pair of out-of-phase signals. The triode 46 and its associated circuit are designated by the reference numeral 12 in FIGURE 1. One of the output signals from the phase inverter is connected through a coupling condenser 48 to the grid 50 of the upper triode 52 which is connected as a conventional audio amplifier. The other signal is fed through a coupling condenser 54 to the control grid 56 of a lower triode 58 connected as a conventional audio amplifier.

The output from the upper audio amplifier 52 is connected through the coupling condenser 14 and the diode or rectifier 16 to the control grid 64 of a triode 66 connected as a conventional audio amplifier. The output from the lower amplifier 58 is likewise fed through the coupling condenser 22 and the rectifier 24 to the control grid 72 of a triode 74 connected as a conventional audio amplifier. Each of the diodes 16 and 24 is biased by a variable D.C. voltage which is applied to the diodes 16 and 24 through the balancing potentiometer 34 connected to the diodes. The variable D.C. voltage for the potentiometer 34 is obtained from a rectified envelope of the audio signal. In the illustrated embodiment, this is accomplished by sampling the audio signal before the phase inverter, feeding the sampled signal through a coupling condenser 78 to the control grid 80 of a triode 82 connected as a conventional audio amplifier. The output from the audio amplifier 82 is fed through a coupling condenser 84 to a detector 86 which includes the parallel combination of a diode 88, filter condenser 90 and a threshold level potentiometer 92. The adjustable arm 94 of the threshold level potentiometer 92 is connected to the adjustable arm 96 of the balancing potentiometer 34. It should be apparent that the sampled signal may be obtained at various places in the circuit and that the diodes may be separately biased.

The output from the second mentioned upper audio amplifier 66 is connected through a coupling condenser 98 to a pair of triodes 100 connected as a Schmitt trigger circuit. The triodes 100 and their associated circuits are designated by the reference numeral 18 in FIGURE 1. The trigger circuit provides a rectangular output pulse of variable width which width substantially coincides with the width of the input pulse to the trigger circuit 100. The second mentioned lower audio amplifier 74 is connected through a coupling condenser 102 to a second pair of triodes 104 connected as a Schmitt trigger circuit. The triodes 104 and their associated circuits are designated by the reference numeral 26 in FIGURE 1.

The upper trigger circuit is connected through grid current limiting resistors 106 to the control grids 108 of a pair of power output tubes 110 connected in parallel. The power tubes 110 are biased so as to operate as class B amplifiers. The power tubes 110 and their associated circuits are designated by the reference numeral 20 in FIGURE 1. The rectangular output wave from the lower trigger circuit 104 is likewise fed through grid current limiting resistors 112 to the control grids 114 of a pair of parallel connected power tubes 116. The power tubes 116 and their associated circuits are designated by the reference numeral 28 in FIGURE 1.

The output signals from both the output stages are combined in an output transformer 30 the primary 120 of which is connected into the plates of the power tubes. The composite wave is converted into sound energy by a speaker 32 connected to the secondary 124 of the transformer 30.

This application is a continuation-in-part of my prior application, Serial No. 470,990, filed November 24, 1954, now abandoned.

As previously indicated, it should be apparent that the circuit may be readily constructed by utilizing transistors. Various other changes may be made in the above described high power amplifier without departing from the spirit or scope of the invention.

Various features of the invention are set forth in the accompanying claims.

I claim:

1. In combination, a speech amplification system, comprising a source of speech input signal, means responsive to said input signal to modify the wave shape of said signal, said modified signal being substantially rectangular shaped and varying in duration proportionally as the time between zero crossings of said input signal, and means for amplifying said modified signal, said amplifying means controlled by said modified signal to operate in only a cut-off condition and a conducting condition, and an electroacoustic sound reproducing device connected to said amplifying means for converting the pulses to speech including means to receive the pulse output of the aforementioned amplifying means, an electro-mechanical driving unit, and an acoustic horn coupled to said driving unit.

2. A speech amplification system, comprising a source of speech input signal, means responsive to said input signal to modify the wave shape of said signal, said modified signal being substantially rectangular shaped and varying in duration proportionally as the time between zero crossings of said input signal, and means for amplifying said modified signal, said amplifying means controlled by said modified signal to operate in only a cut-off condition and a conducting condition, and sound reproducing means connected to said amplifying means which is operable by said amplified pulses.

3. In combination, an audio frequency amplification system, comprising a source of audio frequency signal, clipping means having means for adjusting the clippng level, said adjusting means controlled by the input signal envelope, means under control of said clipped signal peaks for generating substantially rectangular shaped pulses, said pulses being of constant amplitude but varying in width substantially as the width of said clipped peaks, and means for amplifying said pulses, said amplifier controlled by said pulse generating means to operate in only a cut-off condition and a conducting condition, and means connected to said amplifying means which is adapted to receive said amplified pulses for converting said pulses into mechanical energy.

4. In combination, an audio frequency amplification system, comprising a source of audio frequency signal, clipping means having means for adjusting the clipping level, means under control of said clipped signal peaks for generating substantially rectangular shaped pulses, said pulses being of constant amplitude but varying in width substantially as the width of said clipped peaks, and means for amplifying said pulses, said amplifier being controlled by said pulse generating means to operate in only a cut-off condition and a conducting condition, and means connected to said amplifier for converting said pulse into mechanical energy.

5. In combination, a speech amplification system, comprising a source of speech signal, means for clipping peaks exceeding a predetermined amplitude from said signal source, means under control of said signal peaks for generating substantially rectangular shaped pulses, said pulses being of constant amplitude but varying in width substantially as the width of said clipped peaks, and means for amplifying said pulses, said amplifying means being controlled by said pulse generating means to operate said amplifier in only two conditions, a cut-off condition and a conducting condition, and means connected to said amplifying means for converting said amplified pulse into speech.

6. In combination, an audio frequency amplification system, comprising a source of input signal of audio frequency, phase inverting means for deriving from said input signal a pair of signals of opposite phase relation, means controlled by said derived signals for generating rectangular shaped pulses, said pulses being of substantially constant amplitude but varying in width substantially as the width of said derived signals, means for amplifying said rectangular shaped pulses, and signal combining means comprising the primary coil of a transformer for combining said pulses to produce alternating positive and negative pulses, and an electroacoustic transducer connected to the secondary of the aforementioned transformer for converting said combined pulses into sound.

7. In combination, an audio frequency amplification system, comprising a source of input signal of audio frequency, phase inverting means for deriving from said input signal a pair of signals of opposite phase relation, means for clipping peaks from said derived signals exceeding a predetermined amplitude, said clipping means including a rectifier and means under control of the input signal envelope for controlling the bias of said rectifier, said bias control means including a bias resistor and a rectifier controlled by the input signal and coupled to said resistor, means controlled by said clipped signals for generating rectangular shaped pulses of substantially constant amplitude but varying in width substantially as the width of said clipped signals, means for amplifying said rectangular shaped pulses, and signal combining means comprising the primary coil of a transformer for combining said pulses to produce alternating positive and negative pulses, and an electroacoustic transducer connected to the secondary of the aforementioned transformer for converting said combined pulses into sound.

8. In combination, an audio frequency amplification system, comprising a source of input signal of audio frequency, means for forming a pair of signals from said input signal of identical frequency but opposite phase relation, clipping means having means for adjusting the clipping level, said adjusting means being controlled by the averaged amplitude of the envelope of the input signal, pulse generating means controlled by said clipped signals for generating a substantially rectangular wave form having a constant amplitude but varying in width substantially as the width of said clipped signals, means controlled by said pulse generating means for amplifying said rectangular shaped signals, said amplifier operable in only the conducting and non-conducting condition, and signal combining means comprising a common load circuit for combining said rectangular shaped signals to produce alternating positive and negative pulses, and an electroacoustic transducer adapted to receive said combined pulses for converting said combined pulses into sound.

9. In combination, an audio frequency amplification system, comprising a source of input signal of audio frequency, phase inverting means under control of said input signal for deriving from said input signal a pair of signals of opposite phase relation, means responsive to said derived signals for modifying the shape of said derived signals, said modified signals being of substantially constant amplitude but varying in width substantially as the width of said derived signals, means for amplifying said modified signals, said amplifying means being controlled by said modified signal to operate in only a cut-off condition and a conducting condition, signal combining means comprising a common load circuit for combining said modified signals to produce alternating positive and negative pulses, and an electroacoustic transducer adapted to receive said combined pulses for converting said combined pulses into sound.

10. In combination, a speech amplification system, comprising an input source of speech signal, phase inverting means for deriving from said input signal a pair of signals of opposite phase relation, means for clipping peaks from said derived signals exceeding a predetermined amplitude including means for adjusting the clipping level, pulse generating means controlled by said clipping means for generating a substantially rectangular shaped pulse, said rectangular pulse having a fixed amplitude but of a duration substantially coinciding with the duration of the said clipped peaks, amplifying means controlled by said pulse generating means to operate in only conducting and non-conducting condition, said amplifying means comprising election discharge devices each having at least a control grid, an anode and a cathode, means for applying said rectangular pulses to said control grid, and signal combining means comprising a common load circuit adapted to receive the output pulses from said electric discharge devices to combine said pulses to produce alternating positive and negative pulses, and an electroacoustic transducer adapted to receive said combined pulses for converting said combined pulses into speech.

11. In combination, a speech amplification system, comprising an input source of speech signal, phase inverting means for deriving from said input signal a pair of signals of opposite phase relation, means for clipping peaks from said derived signals exceeding a predetermined amplitude, means controlled by said clipped signals for generating rectangular shaped pulses of substantially constant amplitude but varying in width substantially as the width of said clipped signals, means for amplifying said rectangular shaped pulses, said amplifying means being controlled by said pulse generating means to operate in only a cut-off condition and a conducting condition, signal combining means comprising the primary coil of a transformer for combining said pulses to produce alternating positive and negative pulses, and an electroacoustic transducer connected to the secondary of the aforementioned transformer for converting said combined pulses into speech.

No references cited.